US006721676B1

(12) United States Patent
Ueda

(10) Patent No.: US 6,721,676 B1
(45) Date of Patent: Apr. 13, 2004

(54) TESTING OF SEMICONDUCTOR DEVICE AND A FABRICATION PROCESS OF A SEMICONDUCTOR DEVICE INCLUDING A TESTING PROCESS

(75) Inventor: Takefumi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/296,488

(22) Filed: Apr. 22, 1999

(30) Foreign Application Priority Data

Apr. 24, 1998 (JP) .......................................... 10-115506
Apr. 5, 1999 (JP) .......................................... 11-098133

(51) Int. Cl.[7] .......................... G06F 19/00; G06F 17/50
(52) U.S. Cl. .......................... 702/123; 714/741; 703/15
(58) Field of Search ................................ 702/116, 117, 702/123, 124, 121; 706/919; 714/31, 745, 38, 741; 324/760, 765; 703/17, 15, 16, 19

(56) References Cited

U.S. PATENT DOCUMENTS 5,537,580 A * 7/1996 Giomi et al. ............... 395/500
5,668,745 A * 9/1997 Day ........................... 364/580
5,845,234 A * 12/1998 Testa et al. ................. 702/119
5,920,490 A * 7/1999 Peters ........................ 714/744
6,061,283 A * 5/2000 Takahashi et al. .......... 365/201
6,363,509 B1 * 3/2002 Parulkar et al. ............ 714/738

OTHER PUBLICATIONS

Hamilton, T. et al., "Solving the Simulation–to–Test Translation Problem", *Test and Measurement World*, Cahners Publishing, Denver, vol. 11, No. 9, Sep. 1, 1988, pp. 47–51.

Taylor, T., "Tools and Techniques for Converting Simulation Model into Test Patterns", *Proceedings of the International Test Conference*, New York, 1993, pp. 133–138.

Benetazzo, L. et al., "Design Criteria for Cae–to–Ate Translation", *Proceedings of the Systems Readiness Technology Conference*, New York, Sep. 24, 1991, pp. 449–452.

* cited by examiner

*Primary Examiner*—Patrick Assouad
(74) *Attorney, Agent, or Firm*—Staas & Halsey LLP

(57) ABSTRACT

A process of converting simulation data to test data used for testing an integrated circuit includes the steps of detecting a transition of state of the simulation data, extracting an event from the simulation data in response to the transition, and creating the test data in response to the event.

27 Claims, 16 Drawing Sheets

本発明のI／Oデッドバンドの検証手順を示す一実施例のフローチャート

シュミレーションデータをテストデータに加工する
手順を示す一例のフローチャート

FIG 2A PRIOR ART
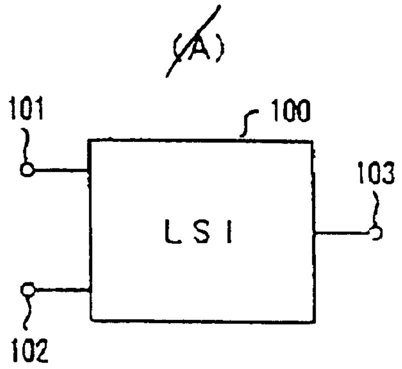
FIG 2B PRIOR ART ~~(B)~~
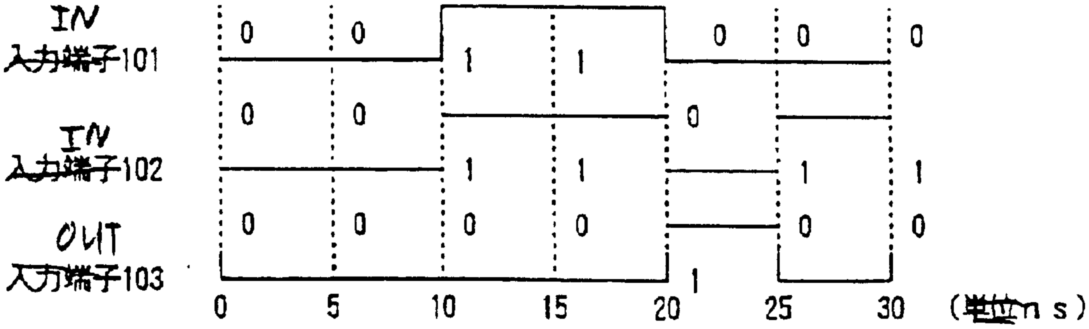
FIG 2C PRIOR ART ~~(C)~~
| | | | | | | | |
|---|---|---|---|---|---|---|---|
| IN ~~入力端子~~101 | 0 | 0 | 1 | 1 | 0 | 0 | 0 |
| IN ~~入力端子~~102 | 0 | 0 | 1 | 1 | 0 | 1 | 1 |
| OUT ~~出力端子~~103 | L | L | L | L | H | L | L |
| TIMING NO ~~タイミングナンバー~~ (TNO) | 1 | 1 | 1 | 1 | 1 | 1 | 1 |
~~横方向に、サイクル経過~~
→ CYCLE
FIG 2D PRIOR ART ~~(D)~~
TNO=1
CYCLE=5ns
IN ~~入力端子~~101 =NRZ, 0ns NRZ (NonReturnZero) ~~波形~~
IN ~~入力端子~~102 =NRZ, 0ns RZ (ReturnZero) ~~波形~~
OUT ~~出力端子~~103 =0ns

| | | EVENT TYPE イベント識別 | EVENT TIME イベント時間(ns) | EDGE TYPE エッジ識別 | EDGE TIMING (ns) エッジタイミング時間(ns) |
|---|---|---|---|---|---|
| IN | 入力端子20 | 1 | 1 | NRZ | 1 |
| IN | 入力端子21 | 1 | 1 | NRZ | 1 |
| OUT | 出力端子22 | 1, 0 | 3, 4 | RZ | 3, 4 |

FIG 6B

| | | | | | | | |
|---|---|---|---|---|---|---|---|
| IN | 入力端子20 | 0 | 1 | 0 | 1 | 0 | 1 |
| IN | 入力端子21 | 0 | 0 | 0 | 1 | 0 | 0 |
| OUT | 出力端子22 | 0 | 0 | 0 | 0 | 0 | 0 |
| | TNO | 1 | 2 | 3 | 1 | 4 | 1 |

FIG 6C

| | | TNO=1 | | TNO=2 | | TNO=3 | | TNO=4 | |
|---|---|---|---|---|---|---|---|---|---|
| | | EDGE TYPE エッジ識別 | EDGE TIMING エッジタイミング時間(ns) | EDGE TYPE エッジ識別 | EDGE TIMING エッジタイミング時間(ns) | EDGE TYPE エッジ識別 | EDGE TIMING エッジタイミング時間(ns) | EDGE TYPE エッジ識別 | EDGE TIMING エッジタイミング時間(ns) |
| IN | 入力端子20 | NRZ | 1 | NRZ | 1 | NRZ | 1 | NRZ | 4 |
| IN | 入力端子21 | NRZ | 1 | NRZ | 2, 4 | NRZ | 2 | RZ | 2, 4 |
| OUT | 出力端子22 | RZ | 3, 4 | RZ | 3, 4 | RZ | 3, 4 | RZ | 3, 4 |

本発明のテストデータの検証手順を表す一実施例のフローチャート

FIG8A EVENT INFO (A) イベント情報

FIG8B EVENT NO (B) イベント番号

FIG8C EVENT TIME (C) イベント時間 (ns)

FIG 9A EVENT INFO

FIG 9B EVENT NO

FIG 9C EVENT TIME

本発明のI／Oデットバンドの検証手順を示す一実施例のフローチャート

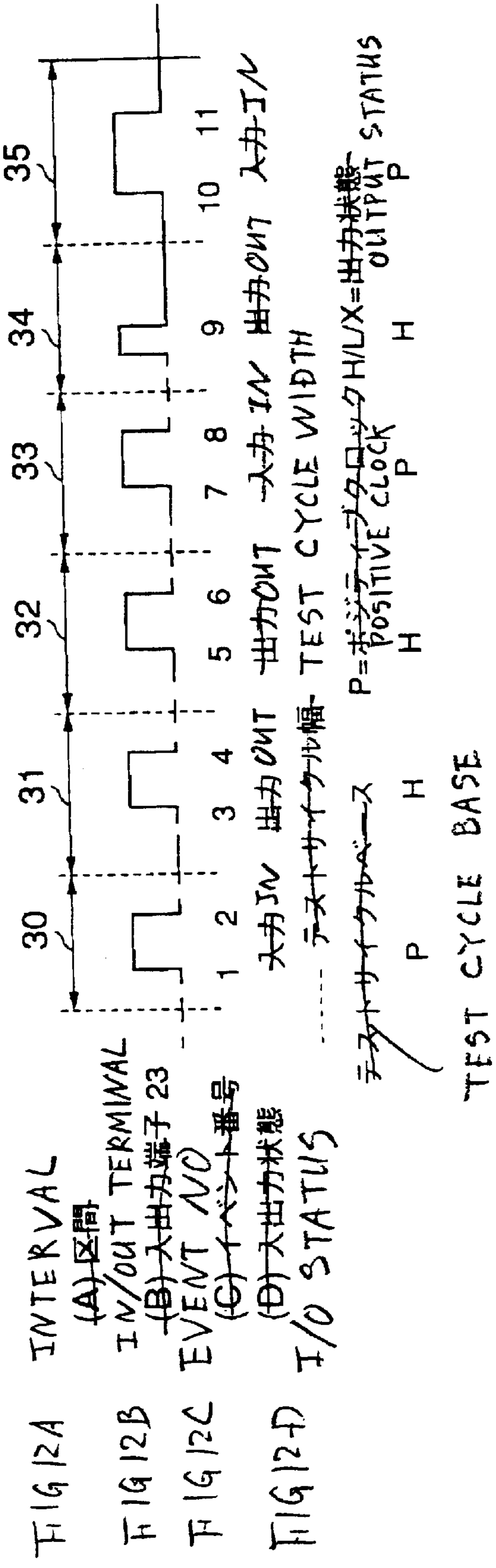
FIG 12A INTERVAL
FIG 12B IN/OUT TERMINAL 23
FIG 12C EVENT NO
FIG 12D I/O STATUS
30
31
32
33
34
35
1 2 3 4 5 6 7 8 9 10 11
IN OUT OUT IN OUT IN
TEST CYCLE WIDTH
TEST CYCLE BASE
P H H P H P
P=POSITIVE CLOCK
H/L/X=OUTPUT STATUS FIG 13A
FIG 13B
FIG 13C
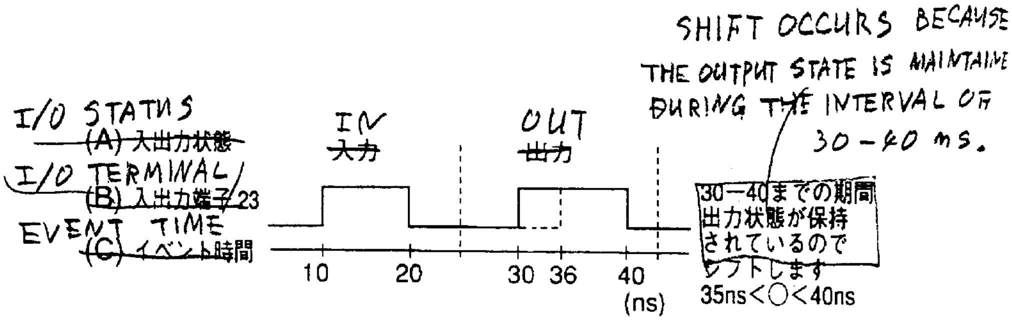
【図１２】
出力状態維持時間の検証の一例の説明図
FIG 14A
FIG 14B
FIG 14C
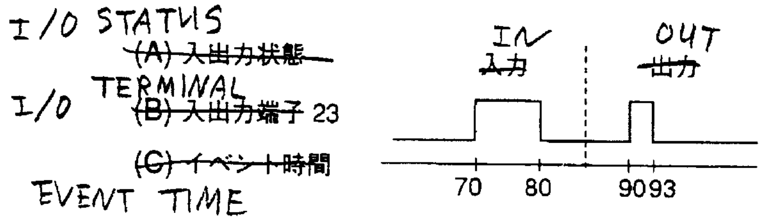

TESTING OF SEMICONDUCTOR DEVICE AND A FABRICATION PROCESS OF A SEMICONDUCTOR DEVICE INCLUDING A TESTING PROCESS

BACKGROUND OF THE INVENTION

The present invention generally relates to fabrication of semiconductor devices and more particularly to a testing of a semiconductor device during a fabrication process of the same and a test data processor used in such testing for creating test data.

With increase in the integration density, the magnitude of integrated circuits is increasing ever and ever. In such very large-scale integrated circuits, the testing for verifying proper operation of the integrated circuit becomes an important problem.

Conventionally, testing of integrated circuits has been made by using simulation data, which represents the expected functional operation of an integrated circuit produced by software simulation, wherein the simulation data is generally provided in the form of sampling data sampled in a time axis with a predetermined sampling interval. The simulation data thus sampled is then processed by a test data processor that converts the sampled simulation data thus obtained into test data suitable for use in actual testing of the integrated circuit. It should be noted that the testing of the integrated circuit is conducted by a tester device while using the test data which represents the result of the simulation in terms of operational cycles. Typically, the test data is produced by sampling the simulation data with a specific sampling interval having a period coincident with the interval of the operational cycle.

FIG. 1 and FIGS. 2A–2D represent a conventional example conducted by a test data processor for converting simulation data into test data, wherein FIG. 1 represents the flowchart of the test data processor while FIGS. 2A–2D represent examples of event information and cycle information of the test data. It should be noted that the event information represents the timing of the simulation data, while the cycle information represents the event information for each cycle thus obtained by sampling the simulation data with the predetermined sampling interval.

Hereinafter, the process of verifying the operation of an integrated circuit 100 of FIG. 2A will be described with reference to the flowchart of FIG. 1. In the example of FIG. 2A, the integrated circuit 100 has input terminals 101 and 102 and an output terminal 103.

Referring to FIG. 1, a step S100 is conducted first, in which the event (transition of state) is detected for the signals appearing on the input/output terminals 101–103 from the diagram of FIG. 2B, wherein FIG. 2B represents the state of the signals appearing at the input/output terminals 101–103. It should be noted that the diagram of FIG. 2B is obtained as a result of the software simulation on the function of the integrated circuit 100 and indicates that the integrated circuit 100 produces an output signal on the output terminal 103 in response to input signals supplied to the input terminals 101 and 102.

After the step S100, a step S110 is conducted on the simulation data of FIG. 2B to extract therefrom test timing information represented in FIG. 2D. It should be noted that the test timing information of FIG. 2D is necessary when sampling the event information included in the simulation data of FIG. 2B to produce the test data.

Referring to FIG. 2D, the test timing information includes: a timing number TNO used to discriminate a plurality of different test timing information from each other; cycle information CYCLE indicative of the sampling interval used for sampling the event information from the simulation data of FIG. 2B; and an event discriminator that represents the mode of signal transition for each of the signals appearing on the input terminals 101 and 102 and the output terminal 103, wherein it should be noted that the event discriminator is used to discriminate the signal transition mode occurring in each sampling interval. For example, a representation such as NRZ or RZ may be used for the event discriminator, wherein NRZ represents the non-return-to-zero transition mode while RZ represents the return-to-zero transition mode. In the illustrated example, there is only one TNO, while there can be a number of different timing numbers TNO corresponding to different test timing information, wherein such different test timing information are used as a template for sampling the simulation data of FIG. 2B with respective, mutually different timings and sampling intervals or cycles.

After the step S110, the process proceeds to a step S120 wherein the simulation data of FIG. 2B is sampled according to the test timing information of FIG. 2D for each TNO, and a step S130 is conducted subsequently wherein test data represented in FIG. 2C is produced in the step S130 from the simulation data sampled in the step S120. It should be noted that the test data contains therein, in addition to the timing number TNO, the logic state of the signals of the input and output terminals 101–103 at the foregoing sampling timing specified by the TNO.

In the illustrated example of FIG. 2B, it should be noted that there exists only one event timing occurring every 5 ns (nanoseconds), and thus, there is only one timing information (TNO="1") as represented in FIG. 2D. As noted before, however, there can be a number of additional event timings corresponding to TNO of other than "1."

The test data of FIG. 2C thus formed has been used by a tester device for the testing of the integrated circuit 100.

However, the foregoing processing to form the test data by a sampling of the simulation data with a predetermined sampling interval or cycle has a drawback in that it is necessary to provide a number of different test timing information, such as the one represented in FIG. 2D with the TNO of "1," in correspondence to the event information of the simulation data to be processed. It should be noted that such test timing information is used as a prior template when extracting the test data such as the one represented in FIG. 2C from the simulation data of FIG. 2B. However, such a process of preparing different templates is complex and takes a substantial time. Thereby, the efficiency of fabrication of the integrated circuits, which includes such a testing process, is inevitably deteriorated.

Further, such a conventional testing process has required that the test data be formed based on exact test timing information in order to ensure that the sampling is made with proper timing. Otherwise, there may be oversight of events or offset in the timing of the events, and the processing of the test data back to the original simulation date may not be possible.

Further, the test data thus formed from the simulation data by sampling the simulation data tends to raise the problem of discrepancy in the accuracy between the simulation data and the tester device, as there is no adaptation made about the accuracy of between the simulation data and the testing conducted by the tester device. Thus, the test data may be unnecessarily accurate as compared with the test actually conducted by the tester device. Alternatively, there may be a case in which the accuracy of the test data may be too rough for the testing by the tester device. In the latter case, no satisfactory testing of the integrated circuit is possible.

Further, because of the lack of ability of verification of semiconductor operation in the case of uncertain events such as incoming of noise, the foregoing conventional process of forming the test data has a problem in that the verification of such uncertain events, which may require accuracy exceeding the accuracy of measurement of the tester device, is not possible.

Further, the conventional process of forming the test data suffers from the problem, when the cycle time used for testing the semiconductor device is too short, in that sufficient input/output dead band is not secured. It should be noted that such an input/output dead band is necessary for switching the state of the semiconductor device between an input state and an output state. Thereby, the testing of the semiconductor device is not possible with the desired precision.

SUMMARY OF THE INVENTION

Accordingly, it is a general object of the present invention to provide a novel and useful method of forming test data for testing a semiconductor device and a fabrication process of a semiconductor device including a testing process using such test data, wherein the foregoing problems are eliminated.

Another and more specific object of the present invention is to provide a method of creating test data used for testing a semiconductor device, from simulation data simulating a function of said semiconductor device, comprising the steps of:

detecting a transition of state of said simulation data; and creating said test data in response to said detected transition of said simulation data.

According to the present invention, the process of preparing sampling information as template is eliminated, and the simulation data is converted directly to the test data. Thereby, the process of provide a number of different templates in advance is eliminated also, and the creation of the test data is conducted easily and efficiently. As the test data is formed based on the actual transition of state of the simulation data, there is no chance that the test data misses the transition in the simulation data, and the testing of the semiconductor device is conducted with reliability and accuracy.

Other objects and further features of the present invention will become apparent from the following detailed description when read in conjunction with the attached drawings.

BRIEF DESCRIPTION OF THE DRAWINGS

FIGS. 2A–2D are diagrams showing various aspects of conventional test data for testing an integrated circuit;

FIGS. 6A–6C are diagrams showing an example of conversion of simulation data to test data according to the first embodiment;

FIGS. 12A–12D are diagrams showing an example of event information included in simulation data according to the third embodiment;

FIGS. 13A–13C are diagrams showing an example of verification of the duration of output state according to the third embodiment;

FIGS. 14A–14C are diagrams showing another example of verification of the duration of output state according to the third embodiment;

DETAILED DESCRIPTION OF THE PREFERRED EMBODIMENTS

First Embodiment

Figure 1:
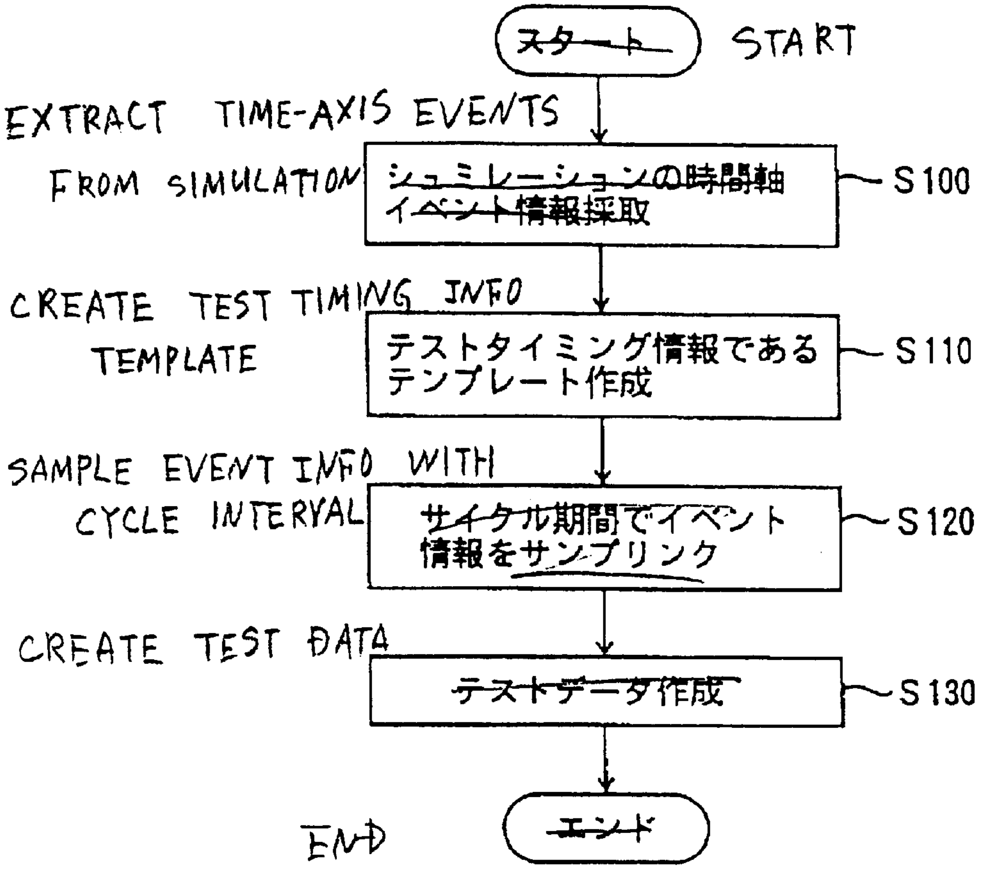
FIG. 1 is a flowchart showing a conventional process of converting simulation data to test data.
Figure 3:
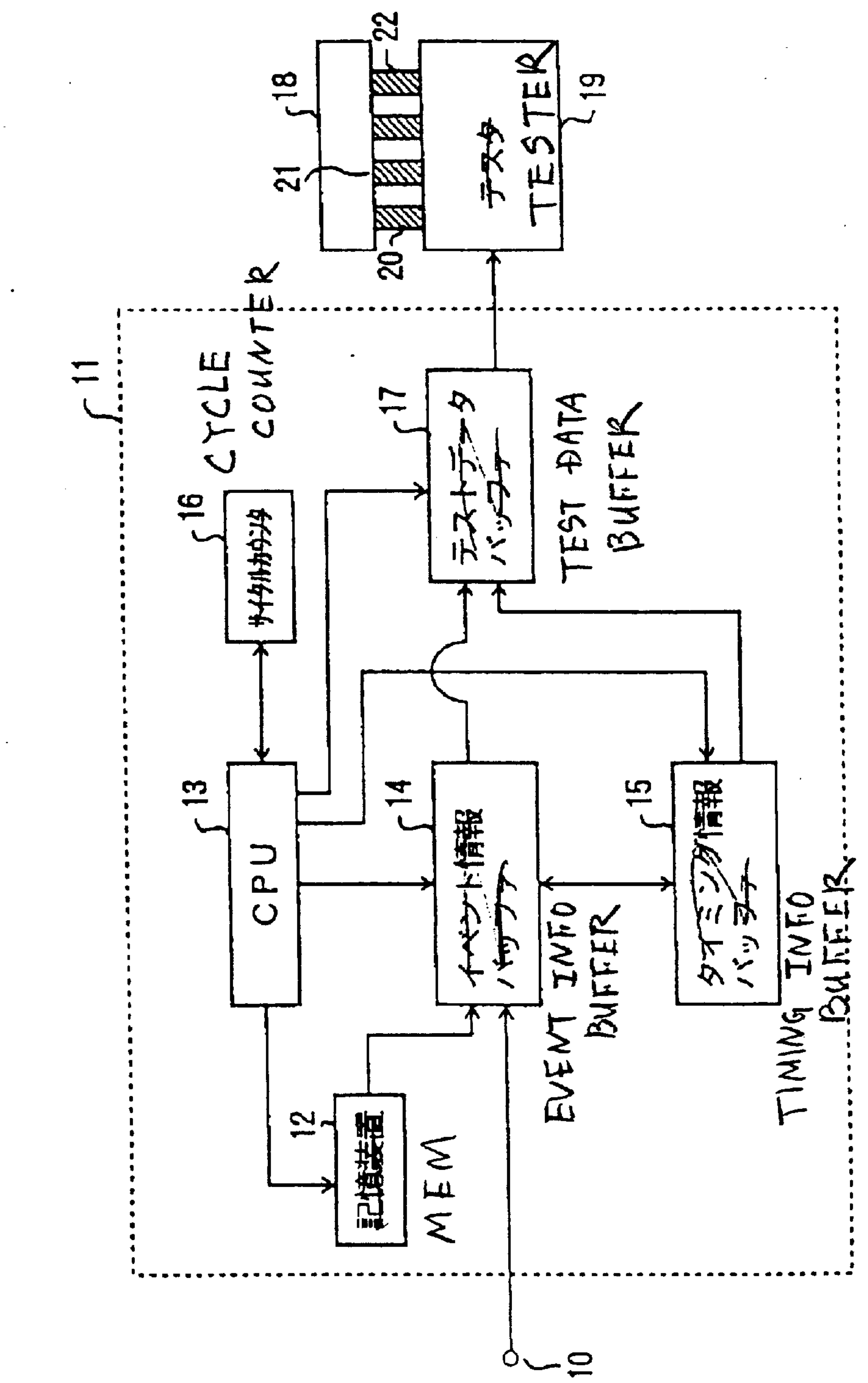
FIG. 3 is a diagram showing the construction of a semiconductor testing system according to a first embodiment of the present invention.

FIG. 3 shows the construction of a semiconductor testing system according to a first embodiment of the present invention.

Referring to FIG. 3, the semiconductor testing system of the present embodiment includes a test data processor 11 and a tester device 19 used for testing an integrated circuit 18 together with the test data processor 11, wherein the test data processor 11 includes a storage device 12 storing simulation data produced by an external simulator. The test data processor 11 further includes a central processing unit (CPU) 13 cooperating with the storage device 12, wherein the test data processor 11 further includes an event information buffer unit 14, a timing information buffer unit 15, a cycle counter 16 and a test buffer unit 17. It should be noted that the construction of FIG. 3 may be realized by any suitable platform including an engineering work station or a personal computer.

In the construction of FIG. 3, the tester device 19 is supplied with test data from the test data processor 11 and conducts a testing of the integrated circuit 18 mounted thereon by using the test data thus supplied, while the test data processor 11 is supplied with the simulation data from an external simulator or a host computer as a result of functional simulation of the integrated circuit 18. The test data processor thereby converts the simulation data into the test data. As noted before, the simulation data represents the continuous change of state of the integrated circuit with time, while the test data represents the change of state in terms of operational cycles.

Figure 4:
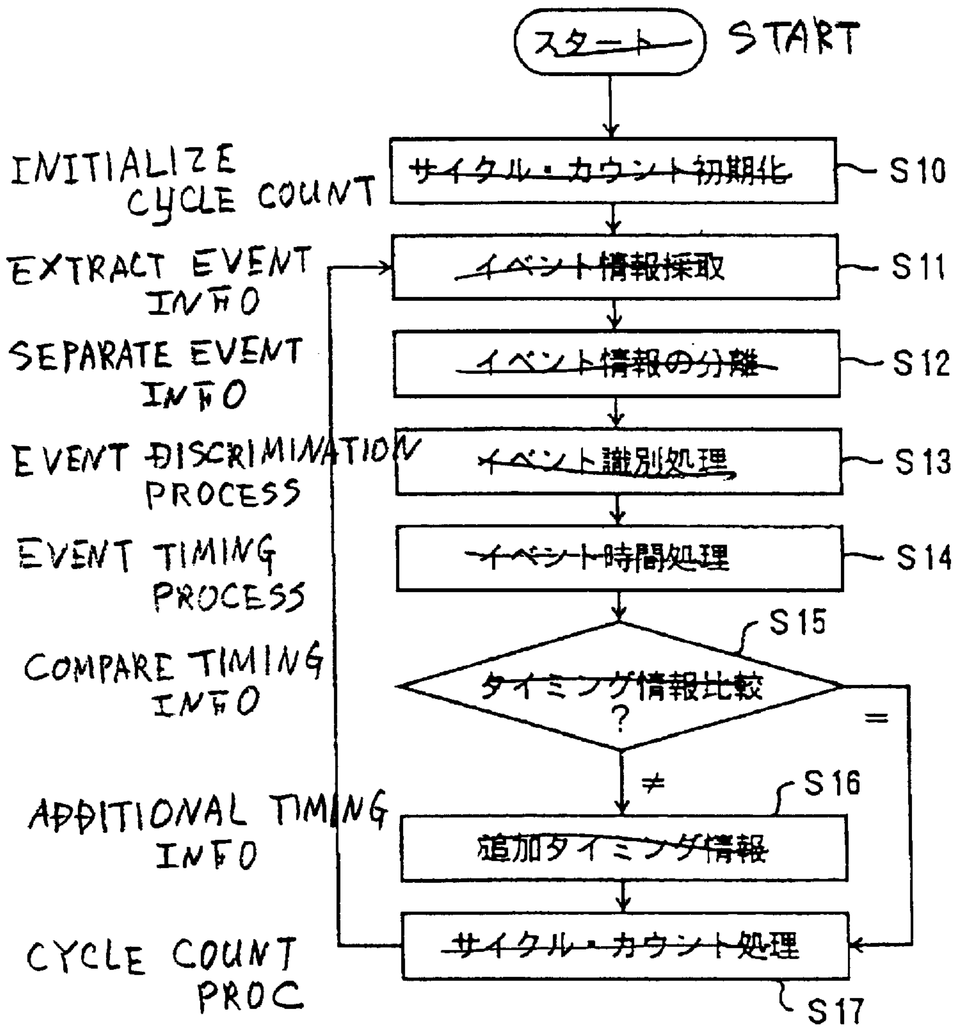
FIG. 4 is a flowchart showing the process of converting simulation data to test data according to the first embodiment.

FIG. 4 shows the operation conducted by the CPU 13 for converting the simulation data to the test data in the form of a flowchart. It should be noted that the process of FIG. 4 is provided in the form of computer-readable program code and is stored in the storage device 12. Alternatively, the program code of FIG. 4 may be given externally in the form recorded on a computer-usable medium such as a CD-ROM or via data communication network.

Referring to FIG. 4, the cycle counter 16 is initialized in the step S10 and the process proceeds to the step S11, wherein the cycle counter 16 stores an accumulated cycle count time as measured from the start of the testing process in the system of FIG. 3 and is used to discriminate the event timing as will be explained later with reference to FIG. 5F during the process of converting the event information included in the continuous simulation data consecutively and continuously to the test data represented in terms of cycle.

Figures 5A, 5B, 5C, 5D, 5E, 5F:
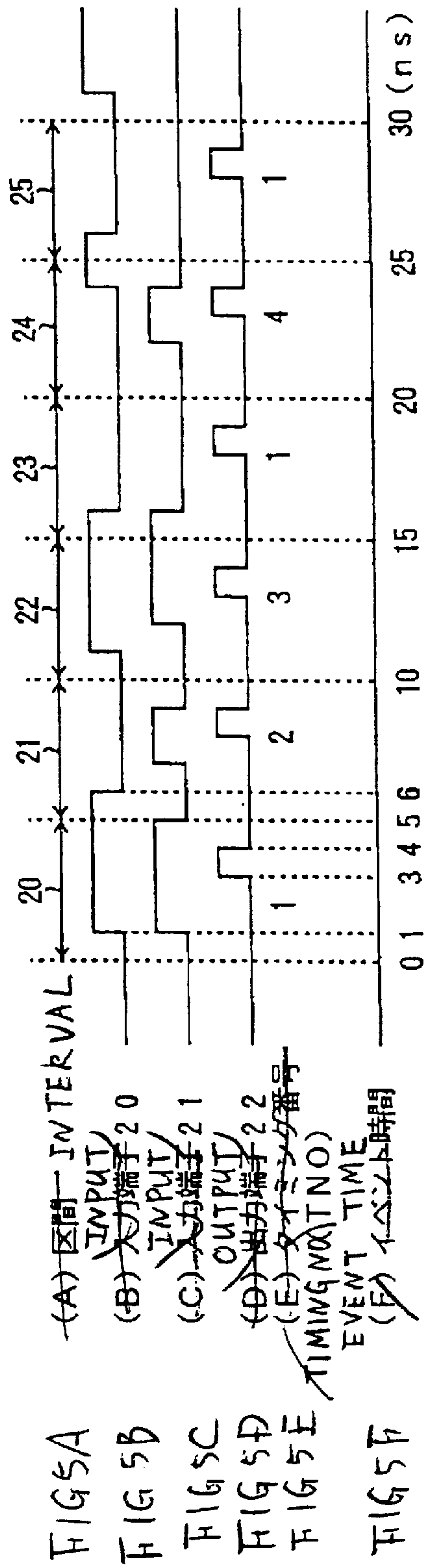
FIGS. 5A–5D and 5F are diagrams showing an example of simulation data together with various event data.

FIGS. 5B–5D show an example of the event information.

Referring to FIGS. 5B–5D, it can be seen that the event information is actually the information indicative of timing of the simulation data or "timing information." In the illustrated example, the continuous simulation data of FIG. 5B and the continuous simulation data of FIG. 5C respectively supplied to an input terminal 20 and an input terminal 21 of the integrated circuit 18 cause a transition in the simulation data on an output terminal 22 as represented in FIG. 5D. Thereby, the test is conducted for each cycle represented in FIG. 5A, wherein it can be seen that FIG. 5A represents intervals 20–25 each corresponding to a cycle. The event information is typically held in the storage device 12. Alternatively, the event information may be supplied externally from a host computer to an input terminal 10 represented in FIG. 4.

Next, in the step S11, the event information represented in FIGS. 5B–5D, which may be held in the storage device 12 or supplied externally from a host computer to an input terminal 10 represented in FIG. 3, is supplied to the event information buffer unit 14 consecutively each cycle, wherein the first data of the event information is supplied, in each cycle time, to a test data buffer 17 of FIG. 3 for creation of test pattern information represented in FIG. 6B.

After the step S11, a step S12 is conducted in which the event information for one cycle thus supplied to the event information buffer unit 14 is separated into event timing information indicative of the timing of transition of the simulation data and event identifier information indicative of the mode of transition ("0/1" or "High/Low") of the simulation data.

For example, the event information for the simulation data of the input terminal 20 during the interval 20 of FIG. 6A is designated with the event identifier "1," in view of the fact that the transition event occurs after 1 ns (nanosecond) from the start of the cycle corresponding to the interval 20 and in view of the fact that the transition of the simulation data occurs from "0" to "1." With regard to the simulation data on the input terminal 21 of FIG. 5C, the event identifier is also "1" in view of the fact that the event occurs with the timing of 1 ns from the start of the cycle 20 and in view of the fact that the transition occurs from "0" to "1."

After the step S12, a step S13 is conducted wherein the number of the event identifier information, indicative of the number of transitions occurring in the simulation data during one single cycle and separated in the step S12, is examined and the event identifier information is converted to "edge identifier information" representing the feature of transition of the waveform. The edge identifier information includes an "NRZ" identifier indicative of the no-return-to-zero waveform for the simulation data, an "RZ" identifier indicative of the return-to-zero waveform of the simulation data, a "2RZ" identifier indicative of two RZ waveforms, and an "FREE" identifier indicative of the waveform including both the NRZ waveform and the RZ waveform.

After the step S13, a step S14 is conducted wherein the value of the accumulated cycle count time supplied from the cycle counter 16 is subtracted from the event timing information obtained in the step S12 and the event timing information is converted to "edge timing information" indicative of the relative timing of the transition with respect to the timing of start of the cycle. In the example of the simulation data of FIG. 5B for the terminal 20, an edge timing of 1 ns is obtained for the interval 21 by subtracting the accumulated cycle count time of 5 ns of the cycle counter 16 from the timing of 6 ns corresponding to the event of transition of the simulation data from "1" to "0."

After the step S14, a step S15 is carried out wherein the edge identifier information and the edge timing information obtained previously in the steps S13 and S14 are used to produce timing information for each cycle as represented in FIG. 6C, wherein it should be noted that the timing information of FIG. 6C includes the edge identifier and edge timing information.

The timing information thus formed is compared with the previous timing information held in the timing information buffer 15 in the step S15 and the process of a step S17 is conducted when there is already the same timing information in the timing information buffer unit 15. When the timing information is not equal to the previous timing information held in the timing information buffer unit 15, on the other hand, the process of a step S16 is conducted, wherein the content of the newly obtained timing information is written into the timing information buffer unit 15.

Thus, in the case of the interval 20, there is no previous timing information in the timing information buffer unit 15 and the timing information obtained in the step S15 is always written into the buffer unit 15. After the step S16, the process proceeds to the step S17.

In the step S17, the current cycle time is added to the cycle count time held in the cycle counter 16, and the process step returns to the step S11. In the illustrated example of FIGS. 5A–5F, it should be noted that the cycle time of 5 ns is added to the accumulated cycle count time in the counter 16.

After the end of the simulation data, the timing information held in the timing information buffer unit 15 is supplied to the test data buffer unit 17, wherein test data buffer unit 17 creates the test data formed of the test pattern information of FIG. 6B and the timing information of FIG. 6C. The test data thus formed may be used immediately in the tester device 19 for testing of the integrated circuit 18 or may be stored in the storage device 12 for later use.

It should be noted that FIG. 6A represents an example of the event identifier information and the event timing information for the interval 20 of FIG. 5A as separated from the simulation data of FIGS. 5B–5D, wherein the information of FIG. 6A is produced as a result of the step S12 of FIG. 4. Further, the information of FIG. 6B corresponds to the steps S11 and S16 of FIG. 4 and includes the header data value or first data value in the cycle time of the event information and the timing numbers TNO included in the interval 20 of FIG. 5A.

Further, FIG. 6C represents the timing information formed of the edge discrimination identifier and the edge timing identifier and is related to the step S15 of FIG. 4.

As explained heretofore, it should be noted that the semiconductor data processor of the present invention performs the process represented in the flowchart of FIG. 4 continuously for processing the simulation data to create the test data. Thus, it is no longer necessary in the present invention to provide a priori timing information including the sampling information for sampling the simulation data as practiced in the conventional process of creating the test data. Thereby, the time needed for creating the test data is reduced substantially.

Further, because of the principle of the present invention to create the timing information based on the event timing information and event discriminator information both extracted from the event information of the actual timing data, the present invention is effective for preventing the oversight of the events or eliminating deviation in the actual event timing and the created event timing. Thereby, it becomes possible to restore the original simulation data from the created test data.

Second Embodiment

Next, a description will be made on a second embodiment of the present invention addressing the compatibility between the accuracy of the simulation and the accuracy of the tester device used for testing the integrated circuit with reference to FIG. 7. The second embodiment also deals with the verification of uncertain events. In the present embodiment, it should be noted that a testing system identical in construction with the testing system of FIG. 3 is used. Thus, the description of the testing system will be omitted.

Figure 7:
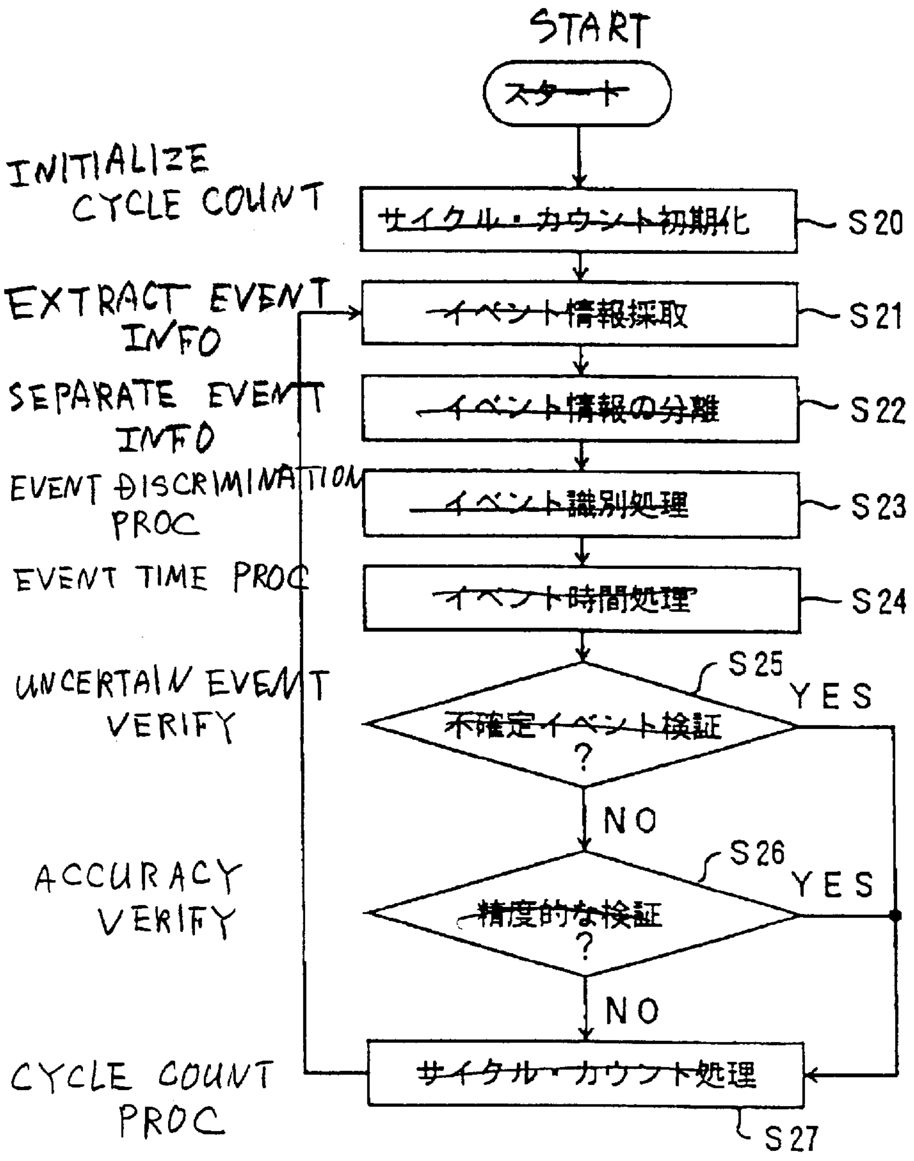
FIG. 7 is a flowchart showing a verification process of the test data according to a second embodiment of the present invention.

Referring to FIG. 7 showing the process conducted by the CPU 13 in the form of flowchart, the process starts with a step S20 corresponding to the step S10 of FIG. 4 and proceeds up to a step S24 corresponding to the step S14 of FIG. 4 similarly to the case of FIG. 4 and a step S25 is conducted after the step S24, wherein a verification process is made in the step S25 about the events that cannot be verified with the accuracy of the tester device 19. Such an event will be referred to as uncertain event.

It should be noted that the process of FIG. 7 is provided in the form-of computer-readable program code and is stored in the storage device 12. Alternatively, the program code of FIG. 4 may be given externally in the form recorded on a computer-usable medium such as a CD-ROM or via data communication network.

Figure 8:
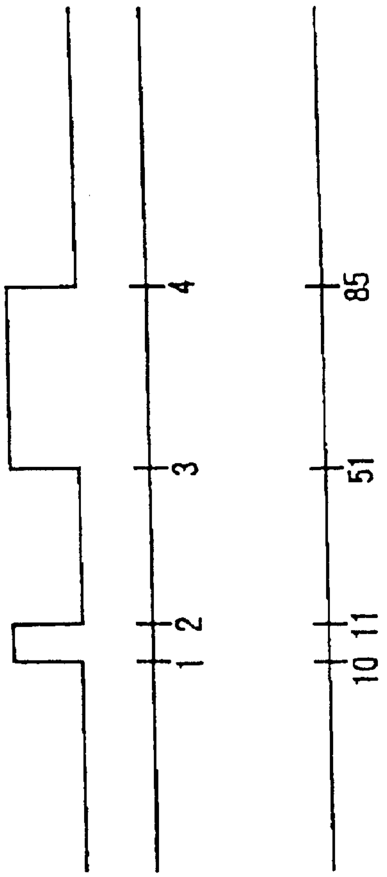
FIGS. 8A–8C are diagrams showing an example of verification of uncertain events of the second embodiment.

FIGS. 8A–8C show an example of such an uncertain event.

Referring to FIGS. 8A and 8B respectively representing the event information and event number for the uncertain event, it will be noted that the events of FIG. 8A having the respective event numbers 1 and 2 as represented in FIG. 8B occur successively with a very short interval of only 1 ns as can be seen from the event timing of FIG. 8C. When the accuracy or resolution of the tester device 19 for the verification of the events is 4 ns, for example, the events occurring with such a short interval are beyond the capability of the tester device 19 for verification.

The uncertain events are such events that exceeds the resolution limit of the tester device 19. In view of the nature of the uncertain events, the tester device 19 cannot conduct the verification of the integrated circuit with respect to such uncertain events. A typical example of such an uncertain event is a noise event. When the existence of such an uncertain event is suspected, it is necessary to carry out the simulation again.

The present embodiment detects the existence of the uncertain event(s) based on the event identifier information and the event timing information held in the event information buffer unit 14. When it is confirmed that there is an uncertain event, the process proceeds to a step S27, while when it is confirmed that there is no uncertain event, the process proceeds to the step S26.

In the step S26, a verification is made with regard to the accuracy of the simulation data and the accuracy of the tester device 19 by using the event identifier information and the event timing information held in the event information buffer unit 14.

Figure 9:
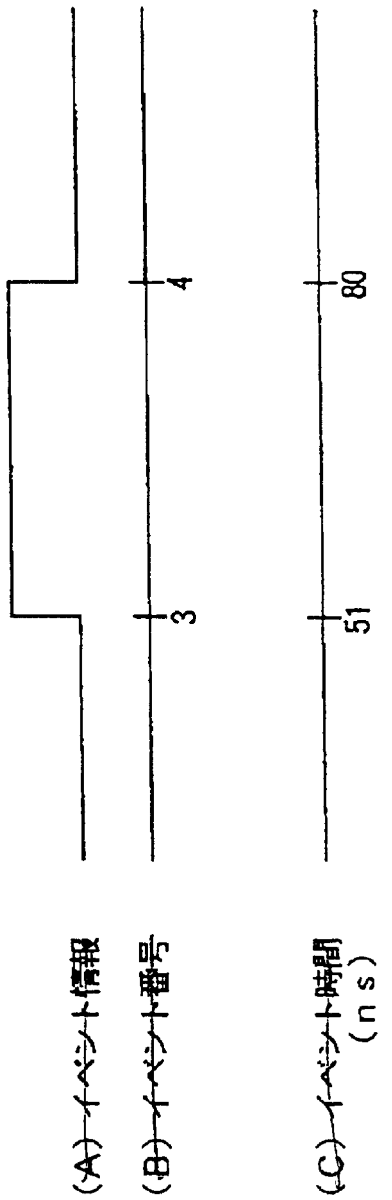
FIGS. 9A–9C are diagrams showing an example of verification of discrepancy in the accuracy between the simulation and tester device according to the second embodiment.

FIGS. 9A–9C show the foregoing verification process conducted in the step S26.

Referring to FIGS. 9A and 9B, the events having the event numbers 3 and 4 (referred to hereinafter merely as events 3 and 4) occur with the timing of 51 ns and 80 ns respectively, as indicated in FIG. 9C.

In the case the tester device 19 has an accuracy of measurement of 4 ns, the verification of the event for the event 4 is achieved successfully in view of the fact that there holds a relationship of 4 ns×20=80 ns. On the other hand, the event 3 cannot be detected at the timing of 51 ns, as the detection of the tester device 19 is made with the timing of 4 ns×13=52 ns or 4 ns×12=48 ns.

Thus, in order to enable the tester device 19 to detect the event 3, the present embodiment corrects the timing of the event 3 so that the event occurs with a timing equal to an integer multiple of the resolution of the tester device 19. Thus, the timing of the event 3 is corrected either to 52 ns (=4 ns×13) or to 48 ns (=4 ns×12).

It should be noted that the existence of the events that requires accuracy exceeding the accuracy of the tester device 19 can be detected based on the event identifier information and the event timing information stored in the event information buffer 14. In the case of FIG. 6A, for example, an accuracy of 1 ns is needed to the verification of the event on the output terminal 22 in view of the fact that the there are event timings of 3 ns and 4 ns for the events on the output terminal 22.

When it is confirmed in the step S26 that there is no such events that require accuracy exceeding the accuracy of the tester device 19 for the verification thereof, the process proceeds directly to a step S27. When the existence of such events is confirmed, on the other hand, the process proceeds to the step S27 after correcting the timing of the event to the integer multiple of the tester accuracy as explained above.

In the step S27, a discrimination is made that a re-simulation is necessary for the case in which the uncertain event is detected in the step S25 or for the case in which the correction of the event timing is made in the step S26. Otherwise, the step S27 merely increases the count number of the cycle counter 16 and the process returns to the step S21.

As described heretofore, the semiconductor testing system of the present embodiment is capable of verifying the operation of the semiconductor device by using test data that includes therein various uncertain events such as noise or spike. Further, the system of the present invention is capable of adapting the test data in conformity with the accuracy of the tester device used actually for testing an integrated circuit. Thereby, the reliability of the test is improved substantially.

Third Embodiment

Next, a semiconductor testing system according to a third embodiment of the present invention will be described with reference to FIG. 10 in relation to the verification of input/output dead band, which arises when switching the state of a terminal from an input state to an output state or vice versa, wherein those parts of FIG. 10 described previously are designated by the same reference numerals and the description thereof will be omitted.

Figure 10:
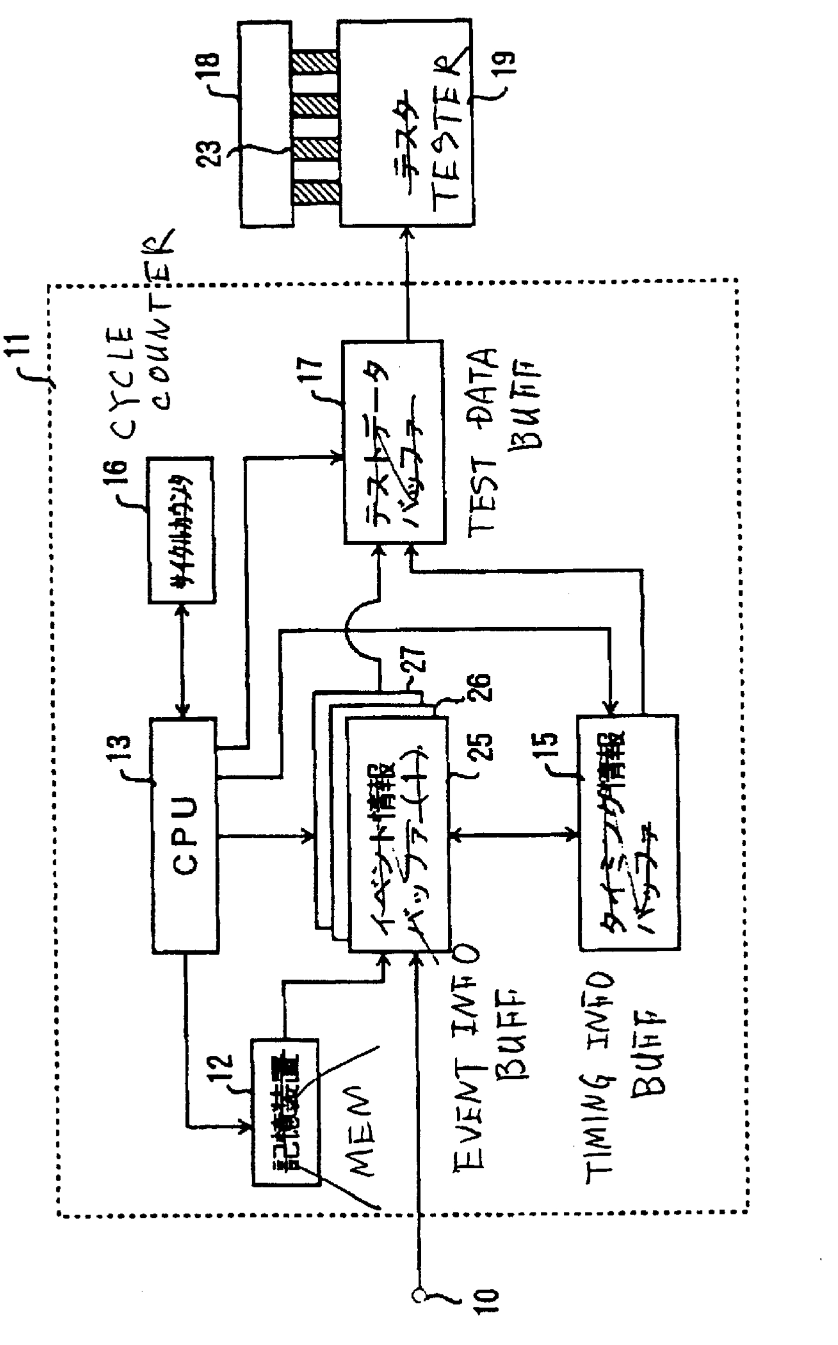
FIG. 10 is a diagram showing the construction of a semiconductor testing system according to a third embodiment of the present invention.

Referring to FIG. 10, the semiconductor testing system includes, in addition to the storage device 12, the CPU 13, the timing information buffer unit 15, the cycle counter 16 and the test data buffer 17, a first event information buffer unit 25, a second event information buffer unit 26 and a third event information buffer unit 27. In the present embodiment, the integrated circuit 18 to be tested is capable of changing the state of the output terminal 23 between an input state and an output state.

Figure 11:
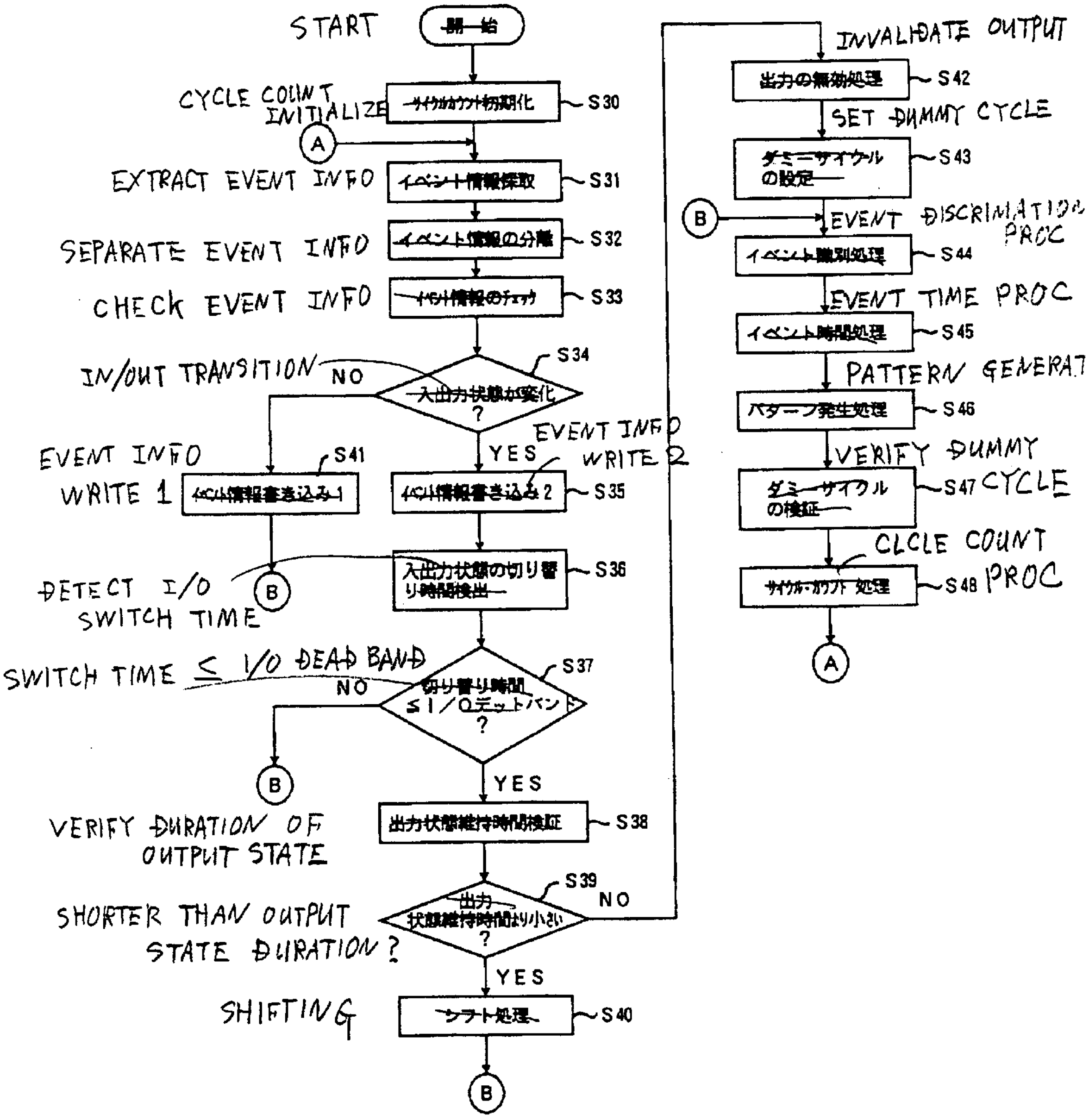
FIG. 11 is a flowchart showing an I/O dead band verification process according to the third embodiment.

FIG. 11 shows the operation conducted by the CPU 13 in the system of FIG. 10 in the form of a flowchart. It should be noted that the process of FIG. 11 is provided in the form of computer-readable program code and is stored in the storage device 12. Alternatively, the program code of FIG. 4 may be given externally in the form recorded on a computer-usable medium such as a CD-ROM or via data communication network.

Referring to FIG. 11, the process starts with a step S30 in which the cycle counter 16, used for detecting the timing of events when converting the event information of the simulation data to cycle-by-cycle test data, is initialized.

After the step S30, a step S31 is conducted in which the event information extracted from the simulation data held in the storage device 12 or supplied externally to the input terminal 10, is supplied to the first event information buffer unit 25 every cycle.

FIG. 12B represents an example of the simulation information wherein it should be noted that the foregoing event information of the simulation data represents the timing of the simulation data of FIG. 12B. The simulation data of FIG. 12B in turn represents the input/output signals appearing on the input/output terminal 23 of the integrated circuit 18.

After the step S31, a step S32 is conducted in which the event information thus supplied to the first event information buffer unit 25 is separated into event timing information indicative of the timing of data transition in the simulation data and event identifier information indicative of the mode (1/0, High/Low, input/output status, etc.) of data transition.

After the step S32, a step S33 is conducted wherein the event identifier information thus extracted in the step S32 is examined, and the process proceeds further to a next step S34, wherein a discrimination is made whether the input/output status for the current interval or cycle has been changed from the input/output status of the previous interval or cycle.

If the result of the discrimination in the step S34 is YES, indicative of the fact that the input/output status has been changed, the process proceeds to a next step S35. On the other hand, when the result of the discrimination in the step S34 is NO, indicating that the there is no such a change in the input/output status, the process proceeds to a step 41 wherein the event timing information and the event identifier information for the current interval held in the first event information buffer unit 25 is forwarded to the second event information buffer unit 26 and the process proceeds further to a step S44.

In the step S35, on the other hand, the event timing information and the event identifier information that has changed since the previous interval are stored in the third event information buffer 27. As will be understood from the description to be made later, the second event information buffer 26 stores the event timing information and the event identifier information for the previous interval which is immediately before the current interval.

In the case of the timing chart represented in FIGS. 12A–12D, it should be noted that the input/output terminal 22 takes an input status in the interval 30 and output status in the interval 31. Thus, the event timing information and the event identifier information for the interval 31 are stored in the third event information buffer unit 27. The event timing information and the event identifier information for the interval 30 are stored in the second event information buffer unit 26.

After the step S35, a step S36 is conducted in which the timing of the last event, the event 2, of the interval 30 held in the second event information buffer unit 26 is compared with the timing of the first event, the event 3, of the interval 31 held in the third event information buffer unit 27, for detection of the duration of switching for the terminal 22 between the input state and the output state.

After the step S36, a step S37 is conducted in which a discrimination is made whether or not the foregoing duration of switching between the input state and the output state is smaller than the duration of dead band for an I/O switching for the terminal 22.

If the result of the step S37 is YES and it is judged that the duration for switching the state of the input/output terminal 22 is shorter than the I/O dead band for the terminal 22, the process proceeds to a next step S38. On other hand, if the result of the step S37 is NO, indicating that the duration for switching the state of the input/output terminal 22 is longer then the I/O dead band, the process proceeds to a step S44.

In the step S38, the possibility of retarding the timing of the event held in the third event information buffer unit 27 while maintaining the output state of the terminal 23 is examined. Hereinafter, the process in the step S38 will be explained with reference to FIGS. 13A–13C showing an example of the simulation data for the input/output terminal 22.

Referring to FIGS. 13A–13C, it can be seen that the timing of the last event held in second the event information buffer unit 26 is 20 ns, while the first timing of the current event held in the third event information buffer unit 27 is 30 ns, indicating that there is a time margin of 10 ns for changing the state of the input/output terminal 23 from the input mode to the output mode as represented in FIG. 13A.

This time margin of 10 ns, however, is not sufficient for causing the actual change of the input/output status of the terminal 23 when there is an I/O dead band of 15 ns for switching the mode of the terminal 23.

Thus, the process of the step S38 evaluates the maximum extent of retarding the timing of the event in the third event information buffer 27 while maintaining the state of the simulation data at the first event timing of 30 ns. Thereby, a value of less than 10 ns is obtained in view of the possible timing between 30 ns and 40 ns. During this interval, the state of the simulation data at the event timing of 30 ns is maintained.

After the step S38, a step of S39 is conducted in which it is discriminated whether or not the magnitude of retardation of the onset timing for the current event for ensuring a larger duration for switching of the input/output status of an input/output terminal, such as the terminal 23, is smaller than the I/O dead band of the input/output terminal.

If the result of the step S39 is YES, the process proceeds to a step S40 wherein the timing of the first event in the third event information buffer unit 27 is retarded and the process proceeds to a step S44. By doing so, it becomes possible to increase the time interval for switching between the input state and output state to be larger than the I/O dead band duration.

On the other hand, if the result of the step S39 is NO, the process proceeds to a step S42.

In the example of the simulation data of FIGS. 13A–13C, it can be seen that the duration necessary for switching the state of the terminal 23 between the input state and the output state is 10 ns and the I/O dead band duration is 15 ns, and thus, the timing of the first event held in the third event information buffer unit 27 is retarded from 30 ns to 36 ns so that there is secured a duration of 16 ns for the switching of the terminal 23 from the input state to the output state.

In the case of the simulation data of FIGS. 14A–14C, on the other hand, there exists an interval of 10 ns (=90 ns–80 ns) between the input state and the output state of the terminal 23. When the I/O dead band has a duration of 15 ns, the magnitude of possible retardation of the first event in the third event information buffer unit 27 is less than 3 ns (=93 ns–90 ns) as long as the state of the first event is to be maintained. Thus, in the case of FIGS. 14A–14C, it is not possible to shift the event timing of 90 ns such there exists an interval of 16 ns between the input state and the output state of the terminal 23.

Thus, in a step S42, an invalidating process is conducted for those output intervals in which the timing retardation of the step S40 is not possible to cure the problem of the I/O dead band. In an example of FIG. 15, the output of an input/output terminal B is invalidated during an interval 54.

After the step S42, the process proceeds to a step S43 wherein a dummy cycle is set to for the invalid interval in which the output terminal is thus invalidated. In order to do this, however, it is necessary that the circuits related to the input state of the terminal B hold the state thereof during the cycle time. For example, the input state may be held, in the case where there is no shift/counter circuit, by setting the state externally for each net circuit. In the case where the input state is held for a duration twice as large as the cycle time or more, it is also possible to set the duration of holding the input state for each net circuit. Alternatively, the holding of the state may be made completely static.

Figures 15A, 15B, 15C, 15D:
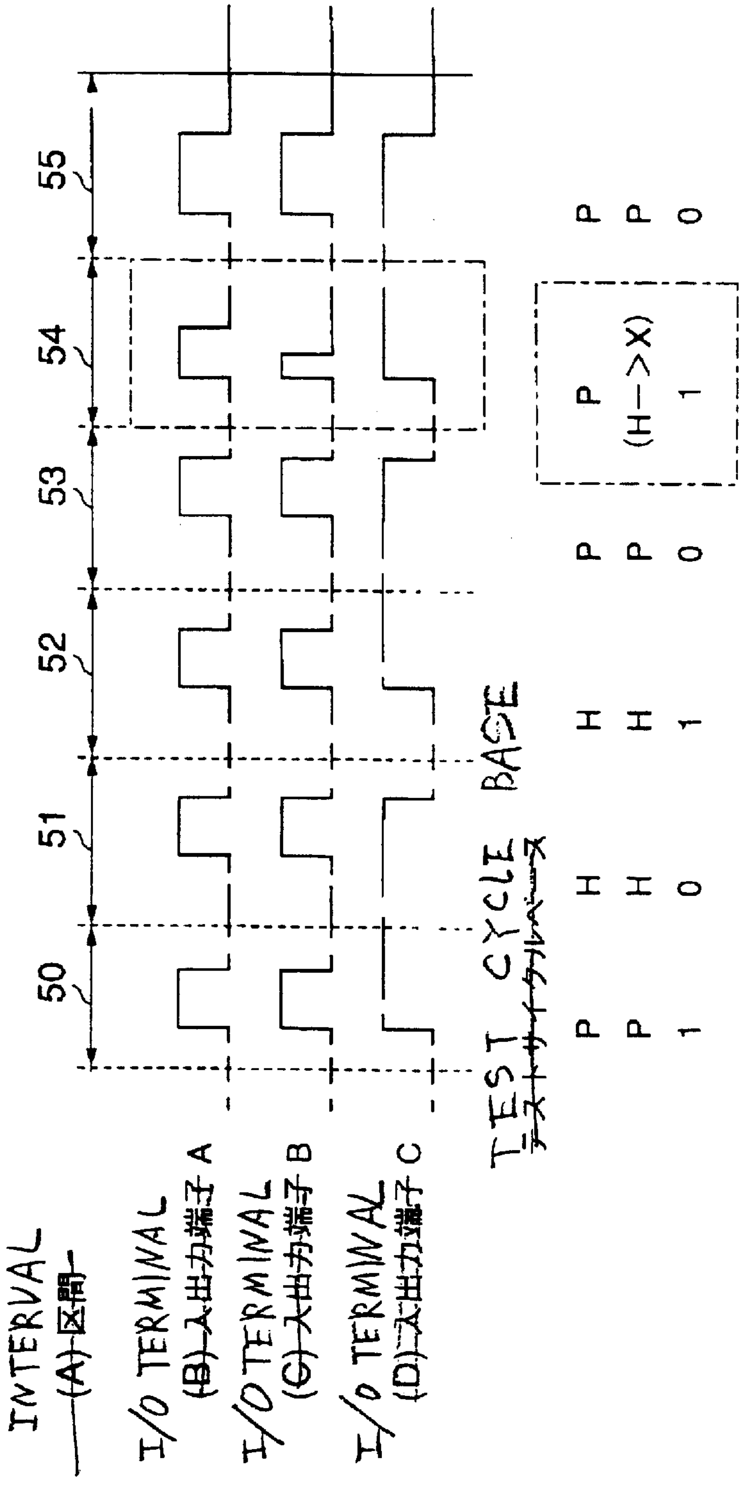
FIGS. 15A–15D are diagrams showing an example of setting of invalid cycle.
Figure 16:
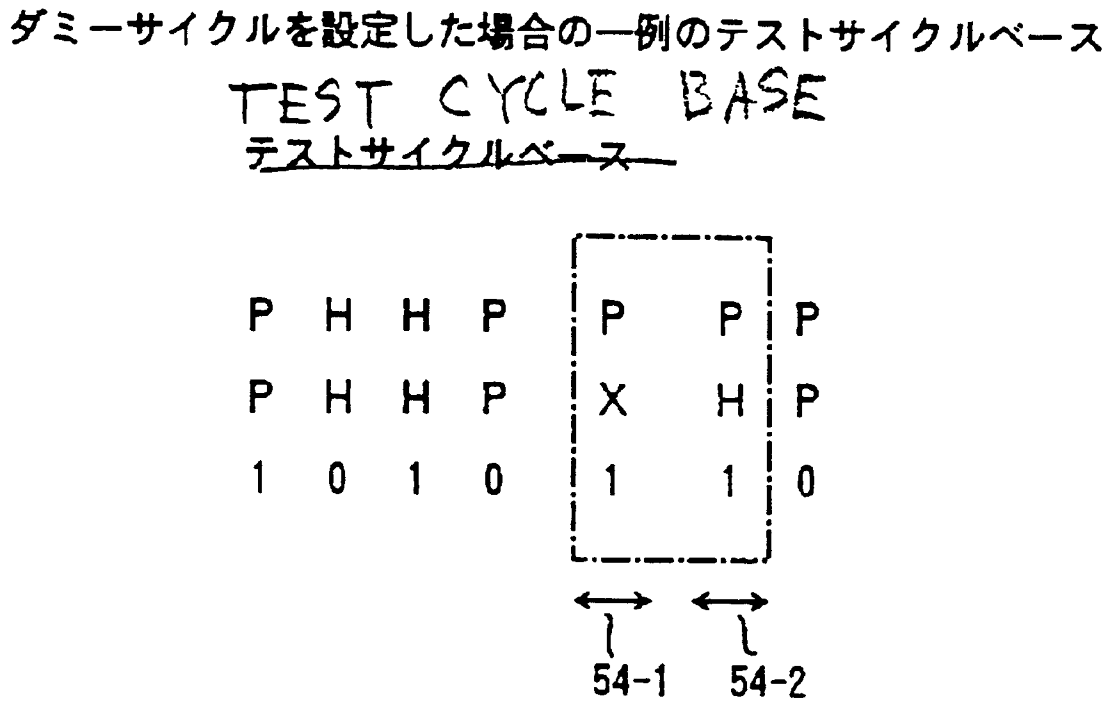
FIG. 16 is a diagram showing an example of a test cycle base in which a dummy cycle is set.

FIG. 16 shows an example of the test cycle base for the case a dummy cycle is set. In the illustrated example of FIG. 16, the invalidated interval 54 of FIG. 15 is converted to a dummy cycle $\mathbf{54}_{-1}$ and a valid cycle $\mathbf{54}_{-2}$ in which the output terminal is validated.

When it is possible to set a dummy cycle, a dummy cycle is set for an interval including the invalidated output terminal, and the events in the interval thus set with the dummy cycle are shifted to a next interval following the dummy cycle. It should be noted that the dummy cycle is set based on the relationship between the time needed for switching between the input state and output state and the duration of the I/O dead band. Thus, there may be a plurality of dummy cycles. In such a case, the total number of the dummy cycles is set by a flag counter.

After the step S43, the process proceeds to step S44 wherein the number of the events (number of data transitions in each cycle time) separated in the step S32 is examined and is converted to edge information indicative of the feature of the waveform. Further, a step S45 is conducted after the step S44 wherein the cycle count time supplied from the cycle counter 16 is subtracted from the event information thus separated in the step S32. Thereby the event timing is converted to an edge timing, which is measured in each cycles.

Next, in the step S46, the edge discriminator information and the edge timing detected in the steps S44 and S45 are used to form the timing information for the cycle. The timing information of a cycle is formed of the edge identifier information and the edge timing information of the cycle.

After the step S46, a step S47 is conducted in which the deviation of cycle count time, which is caused as a result of insertion of the dummy cycle, is corrected. For example, the cycle count time corresponding to the number of the dummy cycles held in the flag counter is subtracted from the cycle count time of the cycle counter 16. Further, in the step S48, the cycle time is added to the cycle count time and the process returns to the step S31.

As described heretofore, the present embodiment conducts, based on the duration needed for switching the state of an input/output terminal and the I/O dead band duration and the duration of the output state, the shifting of events, invalidating of an interval, and setting of a dummy interval. Thereby, the switching of the state of the input/output terminal is made with reliability even in such a case the cycle time is short as compared with the I/O dead band, and it becomes possible to conduct a reliable testing of the integrated circuit.

Fourth Embodiment

Figure 17:
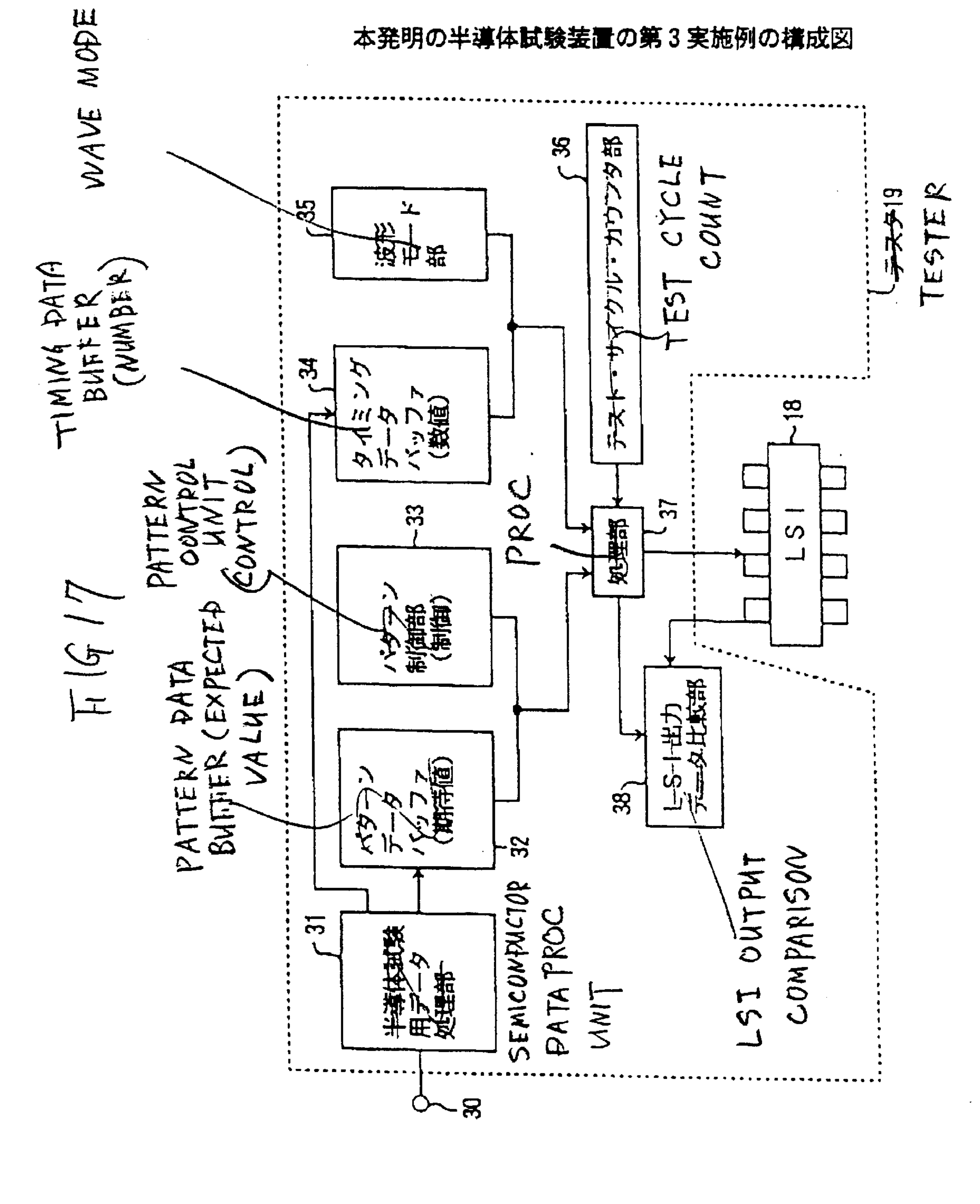
FIG. 17 is a diagram showing the construction of a semiconductor testing system according to a third embodiment of the present invention.

FIG. 17 shows the construction of a semiconductor testing system according to a third embodiment of the present invention, wherein those parts of FIG. 17 corresponding to the parts described previously with reference to preceding drawings are designated by the same reference numerals and the description thereof will be omitted.

Referring to FIG. 17, the tester device 19 includes therein a semiconductor test data processing unit 31 corresponding to the test data processor 11 of FIG. 3, wherein the semiconductor test data processing unit 31 has an input terminal 30 in correspondence to the input terminal 10.

In the system of FIG. 17, the simulation data supplied to the input terminal 30 is converted by the semiconductor test data processing unit 31 and the verification is made for the uncertain events or compatibility between the accuracy of the simulation and the accuracy of the tester device 19. Further, the test pattern information, which may be the one shown in FIG. 6B, is supplied to a pattern data buffer unit 32 and test timing information, such as the one shown in FIG. 6C, is supplied to a timing data buffer unit 34. Thereby, the pattern data buffer unit 32 supplies the test pattern information to a processing unit 37 under control of a pattern control unit 33. Further, the timing data buffer unit 34 supplies the test timing information to the processing unit 37 under control of a waveform mode unit 35.

It should be noted that the processing unit 37 supplies the test pattern information and the test timing information to the integrated circuit 18 to be tested and the testing of the integrated circuit 18 is made in synchronization with a test cycle counter unit 36. Thereby, the output of the integrated circuit 18 is compared with an expected output of the integrated circuit 18 obtained from the test pattern information and the test timing information by using a comparison unit 38.

Further, the present invention is not limited to the embodiments described heretofore, but various variations and modifications may be made without departing from the scope of the invention.

The present application is based on Japanese priority applications No.10-115506 and No.11-98133 respectively filed on Apr. 24, 1998 and Apr. 5, 1999, the entire contents of which are hereby incorporated by reference.

What is claimed is:

1. A method of fabricating a semiconductor device including testing conducted by test data converted from simulation data, said test data being converted from said simulation data according to a process comprising:

detecting a transition of state of said simulation data for each cycle;

extracting an event from said simulation data for each cycle in response to said transition;

holding said event in a buffer unit for each cycle; and creating said test data for each cycle in response to said event held in said buffer unit.

2. A method as claimed in claim 1, wherein said event includes a timing in which said transition of state has occurred and a mode of transition of said simulation data.

3. A method as claimed in claim 2, wherein said test data includes information indicative of said timing and said mode of transition.

4. A method as claimed in claim 1, further including:

shifting a timing of said event to be equal to an integer multiple of a resolution limit, on a time axis, of a testing device used to test said semiconductor device by said test data.

5. A method as claimed in claim 1, further including:

evaluating, from said simulation data, a switching time existing in said simulation data from an end of a first state to a beginning of a next, second state;

discriminating whether or not said switching time is within a dead band of said semiconductor device switching a state thereof from said first state to said second state, a tester device being used to test said semiconductor device by said test data; and retarding a timing of said beginning of said second state to be later than a timing of said switching of said semiconductor device when said switching time is smaller than said dead band.

6. A method as claimed in claim 5, further including;

evaluating a possible, maximum magnitude of retarding said beginning of said second state by examining a duration of said second state, said maximum magnitude of retarding being determined such that said retarding of said beginning of said second state does not go beyond an end of said second state, wherein said retarding said beginning of said second state is conducted when a magnitude of said retarding necessary to set said timing of said beginning of said second state to be later than said timing of said switching of said semiconductor device, is within said maximum magnitude.

7. A method as claimed in claim 6, further including:

invalidating a cycle having said second state when said magnitude of said retarding necessary to set said timing of said beginning of said second state to be later than said timing of said switching of said semiconductor device, exceeds said maximum magnitude.

8. A method as claimed in claim 7, further including:

inserting, between said invalidated cycle and a next cycle following said invalidated cycle, an additional cycle having a state identical with said second state.

9. A computer-implemented method of converting simulation data to test data used for testing a semiconductor device, comprising:

detecting a transition of state of said simulation data for each cycle;

extracting an event from said simulation data for each cycle in response to said transition;

holding said event in a buffer unit for each cycle; and creating said test data for each cycle in response to said event held in said buffer unit.

10. A computer-implemented method as claimed in claim 9, wherein said event includes a timing in which said transition of state has occurred and a mode of transition of said simulation data.

11. A computer-implemented method as claimed in claim 10, wherein said test data includes information indicative of said timing and said mode of transition.

12. A computer-implemented method as claimed in claim 9, further including:

shifting a timing of said event to be equal to an integer multiple of a resolution limit, on a time axis, of a testing device used to test said semiconductor device by said test data.

13. A computer-implemented method as claimed in claim 9, further including:

evaluating, from said simulation data, a switching time existing in said simulation data from an end of a first state to a beginning of a next, second state;

discriminating whether or not said switching time is within a dead band of said semiconductor device switching a state thereof from said first state to said second state, a tester device being used to test said semiconductor device by said test data; and retarding a timing of said beginning of said second state to be later than a timing of said switching of said semiconductor device when said switching time is smaller than said dead band.

14. A computer-implemented method as claimed in claim 13, further including:

evaluating a possible, maximum magnitude of retarding said beginning of said second state by examining a duration of said second state, said maximum magnitude of retarding being determined such that said retarding of said beginning of said second state does not go beyond an end of said second state, wherein said retarding said beginning of said second state is conducted when a magnitude of said retarding necessary to set said timing of said beginning of said second state to be later than said timing of said switching of said semiconductor device, is within said maximum magnitude.

15. A computer-implemented method as claimed in claim 14, further including:

invalidating a cycle having said second state when said magnitude of said retarding necessary to set said timing of said beginning of said second state to be later than said timing of said switching of said semiconductor device, exceeds said maximum magnitude.

16. A computer-implemented method as claimed in claim 15, further including:

inserting, between said invalidated cycle and a next cycle following said invalidated cycle, an additional cycle having a state identical with said second state.

17. A computer specially configured by executing program code stored on a computer usable media for converting simulation data to test data used for testing a semiconductor device, the program code including:

computer-readable program code means for detecting a transition of state of said simulation data for each cycle;

computer-readable program code means for extracting an event from said simulation data for each cycle in response to said transition; computer-readable program code means for holding said event in a buffer unit for each cycle; and computer-readable program code means for creating said test data for each cycle in response to said event held in said buffer unit.

18. A computer as claimed in claim 17, wherein said event includes a timing in which said transition of state has occurred and a mode of transition of said simulation data.

19. A computer as claimed in claim 18, wherein said test data includes information indicative of said timing and said mode of transition.

20. A computer as claimed in claim 17, further including:

computer-readable program code means for shifting a timing of said event to be equal to an integer multiple of a resolution limit, on a time axis, of a testing device used to test said semiconductor device by said test data.

21. A computer as claimed in claim 17, further including:

computer-readable program code means for evaluating, from said simulation data, a switching time existing in said simulation data from an end of a first state to a beginning of a next, second state;

computer-readable program code means for discriminating whether or not said switching time is within a dead band of said semiconductor device switching a state thereof from said first state to said second state, a tester device being used to test said semiconductor device by said test data; and computer-readable program code means for retarding a timing of said beginning of said second state to be later than a timing of said switching of said semiconductor device when said switching time is smaller than said dead band.

22. A computer as claimed in claim 21, further including:

computer-readable program code means for evaluating a possible, maximum magnitude of retarding said beginning of said second state by examining a duration of said second state, said maximum magnitude of retarding being determined such that said retarding of said beginning of said second state does not go beyond an end of said second state, wherein said computer-readable program code means for retarding said beginning of said second state is executed when a magnitude of said retarding necessary to set said timing of said beginning of said second state to be later than said timing of said switching of said semiconductor device, is within said maximum magnitude.

23. A computer as claimed in claim 22, further including:

computer readable program code means for invalidating a cycle having said second state when said magnitude of said retarding necessary to set said timing of said beginning of said second state to be later than said timing of said switching of said semiconductor device, exceeds said maximum magnitude.

24. A computer as claimed in claim 23, further including:

computer-readable program code means for inserting, between said invalidated cycle and a next cycle following said invalidated cycle, an additional cycle having a state identical with said second state.

25. A computer configured by executing program code stored on a computer storage media for converting simulation data to test data for testing a semiconductor device, the computer comprising:

a detector detecting a transition of state of said simulation data;

a extractor extracting an event from said simulation data in response to said transition; and a creator creating said test data in response to said event.

26. A storage medium for storing program code which when executed in a computer causes the computer to convert simulation data to test data for testing a semiconductor device by:

detecting a transition of state of said simulation data for each cycle;

extracting an event from said simulation data for each cycle in response to said transition;

holding said event in a buffer unit for each cycle; and creating said test data for each cycle in response to said event held in said buffer unit.

27. A method of fabricating a semiconductor device including testing conducted using test data converted from simulation data, said simulation data being converted to said test data by applying timing cycles according to a process comprising:

detecting transitions of state of said simulation data according to the timing cycles;

extracting successive events from said simulation data in accordance with respective timing cycles in response to respective transitions of state;

holding successive events in a buffer unit for only one timing cycle; and creating said test data from the successive events held in the buffer unit for only one timing cycle by accumulation of said successive events.

* * * * *